United States Patent
Manasterski et al.

(10) Patent No.: US 12,163,217 B2
(45) Date of Patent: Dec. 10, 2024

(54) SUBSTRATE COMPRISING A SILVER-PLATED SURFACE PROTECTED AGAINST SILVER TARNISHING AND METHOD FOR MANUFACTURING SUCH A SUBSTRATE

(71) Applicant: The Swatch Group Research and Development Ltd, Marin (CH)

(72) Inventors: Christian Manasterski, Colombier (CH); Vladislav Spassov, Praz (CH); Cédric Faure, Cortaillod (CH)

(73) Assignee: The Swatch Group Research and Development Ltd, Marin (CH)

( * ) Notice: Subject to any disclaimer, the term of this patent is extended or adjusted under 35 U.S.C. 154(b) by 591 days.

(21) Appl. No.: 17/278,139

(22) PCT Filed: Sep. 13, 2019

(86) PCT No.: PCT/EP2019/074548
§ 371 (c)(1),
(2) Date: Mar. 19, 2021

(87) PCT Pub. No.: WO2020/058130
PCT Pub. Date: Mar. 26, 2020

(65) Prior Publication Data
US 2021/0348270 A1    Nov. 11, 2021

(30) Foreign Application Priority Data
Sep. 21, 2018  (EP) ..................... 18195860

(51) Int. Cl.
*C23C 16/40* (2006.01)
*C22C 5/08* (2006.01)
(Continued)

(52) U.S. Cl.
CPC ............... *C23C 16/40* (2013.01); *C22C 5/08* (2013.01); *C23C 16/403* (2013.01);
(Continued)

(58) Field of Classification Search
CPC ..... C23C 16/40; C23C 16/403; C23C 16/405; C25D 5/623; C25D 7/005
See application file for complete search history.

(56) References Cited

U.S. PATENT DOCUMENTS

| | | |
|---|---|---|
| 2009/0004386 A1 | 1/2009 | Makela et al. |
| 2012/0021138 A1 | 1/2012 | Ditizio et al. |

(Continued)

FOREIGN PATENT DOCUMENTS

| | | | |
|---|---|---|---|
| CH | 706915 A2 * | 3/2014 | ........... G04B 37/223 |
| CH | 711 122 A2 | 11/2016 | |

(Continued)

OTHER PUBLICATIONS

Machine translation of EP 3220212 (Year: 2017).*
(Continued)

*Primary Examiner* — Zachary M Davis
(74) *Attorney, Agent, or Firm* — Oblon, McClelland, Maier & Neustadt, L.L.P.

(57) ABSTRACT

A substrate includes a final silver-plated surface protected against silver tarnishing by a protective coat having a thickness between 1 nm and 200 nm, the protective coat includes a first coat of $Al_2O_3$ deposited on said final silver-plated surface and having a thickness between 0.5 nm and 100 nm, and on the first coat of $Al_2O_3$, a second coat of $TiO_2$ having a thickness between 0.5 nm and 100 nm, the substrate including a coat of a silver and copper alloy comprising between 0.1% and 10% by weight of copper with respect to the total weight of the alloy, forming said final silver-plated surface, said coat of a silver and copper alloy having a
(Continued)

thickness between 1000 nm and 3000 nm. Embodiments also relate to a method for manufacturing such a substrate.

10 Claims, 1 Drawing Sheet

(51) Int. Cl.
  *C23C 16/455* (2006.01)
  *C25D 5/00* (2006.01)
  *C25D 5/10* (2006.01)

(52) U.S. Cl.
  CPC ...... *C23C 16/405* (2013.01); *C23C 16/45536* (2013.01); *C25D 5/10* (2013.01); *C25D 5/623* (2020.08); *C25D 5/627* (2020.08)

(56) References Cited

U.S. PATENT DOCUMENTS

| | | |
|---|---|---|
| 2014/0335272 A1 | 11/2014 | Makela et al. |
| 2016/0060758 A1* | 3/2016 | Marquardt ........ C23C 16/45553 427/255.35 |
| 2019/0078209 A1 | 3/2019 | Boccard et al. |

FOREIGN PATENT DOCUMENTS

| | | | |
|---|---|---|---|
| CN | 103215560 A | 7/2013 | |
| EP | 1 994 202 A1 | 11/2008 | |
| EP | 3220212 A1 * | 9/2017 | ............. C22C 19/05 |
| EP | 3 456 859 A1 | 3/2019 | |
| JP | 9-176868 A | 7/1997 | |
| JP | 11-158655 A | 6/1999 | |
| JP | 2002-527885 A | 8/2002 | |
| JP | 2006-250654 A | 9/2006 | |

OTHER PUBLICATIONS

Machine translation of CH 706915 (Year: 2014).*
Machine Translation of CH 711122 (Year: 2016).*
Combined Chinese Office Action and Search Report issued Sep. 13, 2022, in Chinese Patent Application No. 201980062075.3 (with English translation), 21 pages.
Written Opinion issued Dec. 5, 2019 in PCT/EP2019/074548 filed on Sep. 13, 2019 (submitting English translation only), 9 pages.
International Search Report issued on Dec. 5, 2019 in PCT/EP2019/074548 filed on Sep. 13, 2019, 3 pages.
Paussa et al., "Protection of silver surfaces against tarnishing by means of alumina/titania-nanolayers", Surface & Coatings Technology, 2011, vol. 206, No. 5, pp. 976-980, XP028333483.
Salmi, "Atomic Layer Deposited Coatings for Corrosion Protection of Metals", Oct. 30, 2015, Retrieved from the Internet: https://helda.helsinki.fi/bitstream/handle/10138/156985/atomicla.pdf?sequence=1&isAllowed=y [retrieved on Dec. 3, 2018], 84 pages, XP055529235.
Office Action issued May 24, 2022, in corresponding Japanese Patent Application No. 2021-515468 (with English Translation), 6 pages.

* cited by examiner

SUBSTRATE COMPRISING A SILVER-PLATED SURFACE PROTECTED AGAINST SILVER TARNISHING AND METHOD FOR MANUFACTURING SUCH A SUBSTRATE

FIELD OF THE INVENTION

The invention relates to a substrate comprising a final silver-plated surface protected against silver tarnishing by a protective coat. Such a substrate comprising a silver-plated surface is particularly a horological element, such as a dial, an applique or a hand, capable of being coated with a thin coat of silver. The present invention also relates to a method for manufacturing such a substrate.

BACKGROUND OF THE INVENTION

In the field of horology, it is usual to make a horological element by coating a substrate with a thin coat of silver, deposited preferably galvanically, in order to give the horological element the very white and unique appearance of silver. Such a horological element is for example a dial, made of brass or gold, coated with a thin layer of silver.

However, silver has the drawback of tarnishing over time. To solve this problem, it is known to protect the sensitive silver-plated surface of the horological element by the Zapon varnishing method. Zapon varnish is a cellulose varnish that can be diluted in a solvent. Zapon varnishing is a method which consists of applying, for example by spraying, on the surfaces to be protected several coats of cellulose varnish, then placing them in a furnace to accelerate the hardening thereof. The final coating has a total thickness of about 8 to 15 μm.

However, this cellulose varnish only protects sensitive metals imperfectly. Furthermore, the required thickness of cellulose varnish deposited conceals fine structuring details, such as engine-turning frequently used to decorate a dial. Accordingly, the details of the engine-turning are not enhanced, and can even disappear under the coats of varnish. Finally, the coats of cellulose varnish modify the cover and appearance of the protected silver-plated surface by varying the L* parameter (of the CIE L*a*b* colour space).

In order to replace the Zapon varnishing method, it has been proposed to deposit a protective coat on the sensitive silver-plated surface by means of an ALD method, as described in the patent EP 1 994 202. This method makes it possible to deposit an extremely thin (50 nm and 100 nm) and highly protective coating, the protection obtained being greater than the protection obtained with a coating of typically 10 μm of cellulose varnish.

However, this ALD has the drawback that the use of an inadequate protective coat deposited on the silver-plated surface of the substrate reduces the brightness of the silver and modifies the aesthetic rendering of the silver-plated surface.

Moreover, the ALD method also has the drawback of forming, on the silver-plated surface of the substrate, a protective coat having a poor adherence to said silver-plated surface, such that said protective coat deposited by ALD is delaminated at the slightest stress for example during final decoration operations using pad printing or another process.

SUMMARY OF THE INVENTION

The aim of the invention is that of remedying these drawbacks by proposing a substrate having a silver-plated surface protected effectively against silver tarnishing while preserving the final appearance of said silver-plated surface, and in particular the brightness and colour of the silver.

For this purpose, the invention relates to a substrate comprising a final silver-plated surface protected against silver tarnishing by a protective coat having a thickness between 1 nm and 200 nm.

According to the invention, said protective coat comprises a first coat of $Al_2O_3$ deposited on said final silver-plated surface and having a thickness between 0.5 nm and 100 nm, and on the first coat of $Al_2O_3$, a second coat of $TiO_2$ having a thickness between 0.5 nm and 100 nm.

The substrate comprises below the protective layer a coat of substantially pure or alloyed silver having a thickness between 1 and 3 microns. This thickness makes it possible to:
- seal the coat of substantially pure or alloyed silver cleanly, i.e. have a porosity-free coat. This porosity-free coat forms a perfectly homogeneous surface for depositing the protective coat. Thus, there are no open zones on the substrate, and in particular on potentially visible non-silver-plated parts after depositing the protective coat,
- remain under 5 microns as thicknesses of 5 microns and over will smooth the decorations, for example of the dial. For example, manual engine-turning has a depth of 30 to 50 microns which would become indistinct with the deposition of an overly thick coat.

The present invention also relates to a method for manufacturing such a substrate comprising a final silver-plated surface protected against silver tarnishing by a protective coat, said method comprising the following steps:
a) obtaining a substrate having a final silver-plated surface
b) depositing on at least a part of said final silver-plated surface from step a) at least one protective coat against silver tarnishing having a thickness between 1 nm and 200 nm, said step b) comprising a first step b1) of depositing, on at least a part of said final silver-plated surface from step a), a first coat of $Al_2O_3$ having a thickness between 0.5 nm and 100 nm, and a second step b2) of depositing, on the first coat of $Al_2O_3$ obtained in step b1), a second coat of $TiO_2$ having a thickness between 0.5 nm and 100 nm.

Surprisingly, the order and the thickness of the first coat of $Al_2O_3$ and of the second coat of $TiO_2$ make it possible to obtain a protective coat against silver tarnishing which enhances the very white colour of the silver as much as possible, thus preserving the silvery brightness of the final surface of the substrate.

According to the invention, the method comprises a step a3) of depositing a coat of substantially pure silver on said substrate to obtain said final silver-plated surface, the coat of substantially pure silver having, preferably, a thickness between 1000 nm and 3000 nm.

According to an alternative embodiment, the method comprises a step a1) of depositing on said substrate a coat of a silver and copper alloy comprising between 0.1% and 10% by weight of copper with respect to the total weight of the alloy to obtain said final silver-plated surface, said coat of silver and copper alloy having, preferably, a thickness between 1000 nm and 3000 nm.

BRIEF DESCRIPTION OF THE DRAWINGS

Further specificities and advantages will emerge clearly from the description given hereinafter, which is by way of indication and in no way limiting, with reference to the appended drawings, wherein.

DETAILED DESCRIPTION OF PREFERRED EMBODIMENTS

The present invention relates to a substrate comprising a final silver-plated surface protected against silver tarnishing by a protective coat.

Such a substrate is for example a horological or jewellery element, and particularly an external horological part element. In particular, the substrate can be a timepiece dial, which can have a structuring on the surface thereof, such as engine-turning, i.e. a set of lines with fine details, which intersect with a view to obtaining a decorative effect. The substrate can be an index, a decoration mounted on the dial (moon phase or other, or a hand.

The substrate is preferably metallic. It can be made of brass, based on yellow or white gold, or silver, or any other suitable metal or metal alloy, precious or not.

The substrate can have an initial silver-plated surface or not.

The substrate can comprise an initial silver-plated surface, said substrate then being based on silver (pure silver or silver alloy, particularly silver alloys with an Ag content >90% by weight) and having intrinsically said initial silver-plated surface also forming the final silver-plated surface. The protective coat is then deposited directly on the silver-based substrate.

Figure 1:
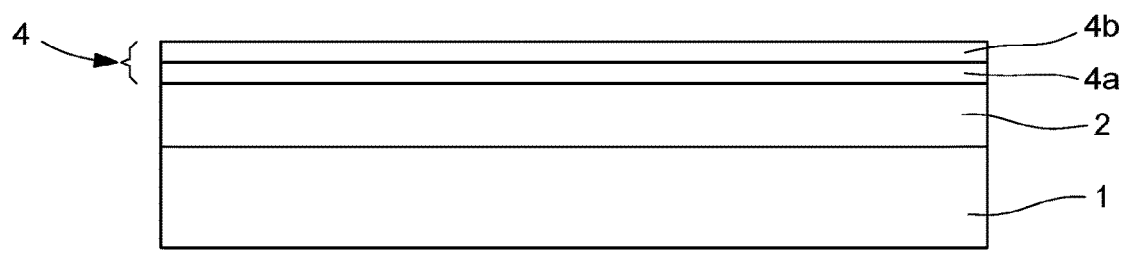
FIG. 1 is a schematic view of a first alternative embodiment of substrate according to the present invention.

With reference to FIG. 1, a substrate 1 according to a first alternative embodiment of the invention is represented whereby the substrate 1 can have no initial silver-plated surface or comprise an intrinsic silver-plated surface. In the first case, the substrate can be for example made of brass, based on yellow or white gold, or any other suitable metal or metal alloy, precious or not, with the exception of silver. In the second case, the substrate 1 is based on silver, made of solid silver for example, and has intrinsically an initial silver-plated surface.

Advantageously, the substrate 1 comprises a coat 2 of a silver and copper alloy comprising between 0.1% and 10% by weight of copper with respect to the total weight of the alloy, forming said final silver-plated surface. The coat 2 of silver and copper alloy can be deposited directly on the substrate 1, in particular when said substrate 1 is not based on silver, and take the place of the fine silver coating conventionally used. The coat 2 of silver and copper alloy can be deposited by any suitable method, such as PVD (flash deposition), or galvanically by means of a suitable silver and copper galvanic bath.

Figure 2:
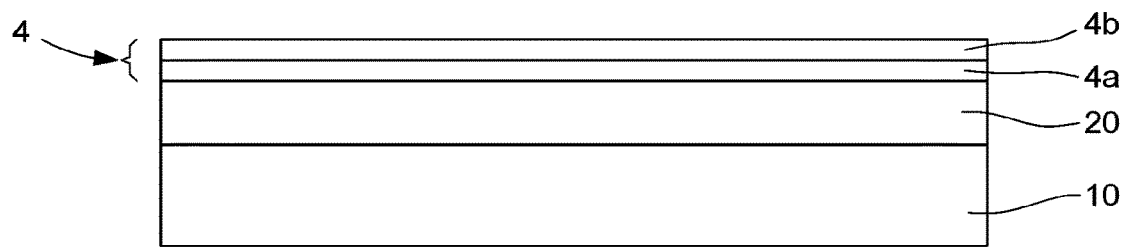
FIG. 2 is a schematic view of a second alternative embodiment of substrate according to the present invention.

With reference to FIG. 2, a substrate 10 according to a second alternative embodiment of the invention is represented whereby the substrate 10 is not based on silver and comprises a coat 20 of substantially pure silver forming said final silver-plated surface. Such a coat 20 is preferably deposited galvanically. The substrate 10 can be itself made of brass and coated with a coat of precious metal, deposited for example galvanically, for example a coat of gold. The substrate 10 can also be a solid precious metal, for example made of solid gold. If necessary, intermediate metallic coats known to a person skilled in the art can be used to prevent any intermetallic diffusion between certain metals initiated by heat treatments or the ALD process.

Figure 3:
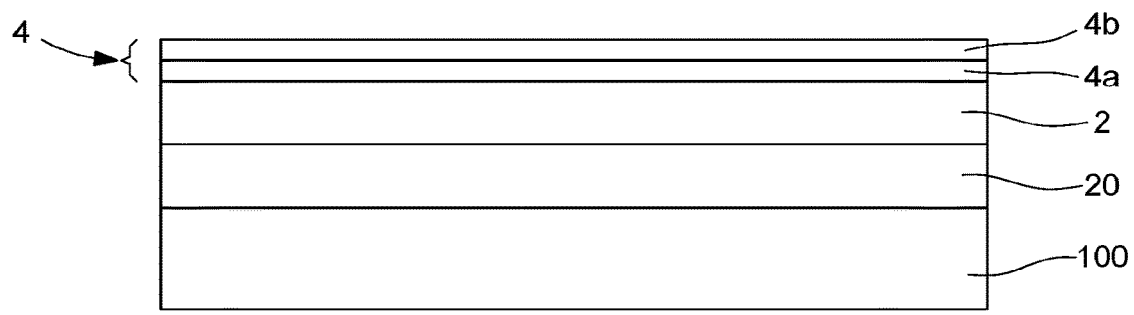
FIG. 3 is a schematic view of a third alternative embodiment of substrate according to the present invention.

With reference to FIG. 3, a substrate 100 according to a third alternative embodiment of the invention is represented whereby the substrate 100 is not based on silver and comprises a coat 2 of a silver and copper alloy comprising between 0.1% and 10% by weight of copper with respect to the total weight of the alloy forming said final silver-plated surface. Furthermore, the substrate 100 comprises, between said substrate 100 and said coat 2 of silver and copper alloy, a coat 20 of substantially pure silver.

Regardless of the alternative embodiment with a coat of substantially pure silver, said coat 20 of substantially pure silver can have a thickness between 200 nm and 3000 nm.

According to an embodiment, the coat 20 of substantially pure silver can have a thickness between 200 nm and 600 nm, preferably between 300 nm and 500 nm in order to form a thin silver coating.

According to a preferred embodiment, the coat 20 of substantially pure silver can have a thickness between 1000 nm and 3000 nm, preferably between 1500 nm and 2500 nm in order to form a thick silver coating.

Such a thick silver coating has the advantage of obtaining an intermediate or final coat of substantially pure silver free from porosities, in order to be able to obtain a final silver-plated surface of the substrate free from porosity and thus ensure increased adhesion of the protective coat against silver tarnishing on said final silver-plated surface.

Regardless of the alternative embodiment with a coat of silver and copper alloy, the coat 2 of silver and copper alloy has either a thickness between 200 nm and 600 nm, and advantageously between 300 nm and 400 nm, or, preferably, a thickness between 1000 nm and 3000 nm, and more preferably between 1500 nm and 2500 nm in order to constitute a thick coating having the aforementioned advantages.

Preferably, the silver and copper alloy comprises between 0.2% and 8% by weight, preferably between 0.5% and 7% by weight, of copper with respect to the total weight of the alloy. The proportion of copper with respect to the silver is selected so as to create enough Cu radicals on the surface which will subsequently ensure the adherence of the protective coat against silver tarnishing, without altering the colour of the silver since the coat of silver and copper alloy forms the final silver-plated surface of the substrate.

The final silver-plated surface of the substrate, either the coat of silver and copper alloy 2 of the substrate 1 or 100, or the coat of substantially pure silver 20 of the substrate 10, or the initial silver-plated surface of the surface if it is itself based on silver, is protected against silver tarnishing by a protective coat 4 having a thickness between 1 nm and 200 nm, preferably between 1 nm and 100 nm, and more preferably between 40 nm and 100 nm.

According to the invention, said protective coat 4 comprises a first coat 4a of $Al_2O_3$ deposited on said final silver-plated surface and having a thickness between 0.5 nm and 100 nm, preferably between 0.5 nm and 50 nm, and on the first coat 4a of $Al_2O_3$, a second coat 4b of $TiO_2$ having a thickness between 0.5 nm and 100 nm, preferably between 0.5 nm and 50 nm.

Particularly preferably, the first coat 4a of $Al_2O_3$ has a thickness between 30 nm and 50 nm and the second coat 4b of $TiO_2$ has a thickness between 10 nm and 50 nm.

Advantageously, the protective coat 4 has been deposited by means of a method selected from the group comprising an ALD (Atomic Layer Deposition), PVD (Physical Vapour Deposition), CVD (Chemical Vapour Deposition), and sol-gel deposition. Preferably, the protective coat 4 has been deposited by ALD. A successive ALD deposition of the first coat 4a of $Al_2O_3$ then of the second coat 4b of $TiO_2$ makes it possible to form compact coats and obtain extremely thin and highly protective coatings, with a particularly good aesthetic rendering. The details and parameters of such an ALD deposition are known to a person skilled in the art. They are for example described in the patent EP 1 994 202. The $Al_2O_3$ coat can be obtained from a TMA (Tri-Methyl-Aluminium) precursor, the oxidation of which can be carried out with $H_2O$, $O_2$; or $O_3$. The $TiO_2$ coat can be obtained from TTIP (Titanium Iso ProPoxide) or $TiCl_4$ (Titanium Tri Chloride), the oxidation of which can be carried out with $H_2O$, $O_2$ or $O_3$.

Particularly preferably, the protective coat 4 against silver tarnishing is obtained by means of an ALD deposition of a first coat of $Al_2O_3$ having a thickness between 30 nm and 50 nm and of a second coat 4b of $TiO_2$ having a thickness between 10 nm and 50 nm.

Surprisingly, the combination of the order and the thickness of the first coat of $Al_2O_3$ and of the second coat of $TiO_2$ makes it possible to obtain a protective coat against silver tarnishing which enhances the very white colour of the silver as much as possible, thus preserving the silvery brightness of the final surface of the substrate.

The substrate according to the invention is obtained by means of a manufacturing method which comprises the following steps:
a) obtaining a substrate 1, 10, 100 having a final silver-plated surface
b) depositing on at least a part of said final silver-plated surface from step a) at least one protective coat 4 against silver tarnishing having a thickness between 1 nm and 200 nm, preferably between 1 nm and 100 nm, and more preferably between 40 nm and 100 nm, said step b) comprising a first step b1) of depositing, on at least a part of said final silver-plated surface from step a), a first coat 4a of $Al_2O_3$ having a thickness between 0.5 nm and 100 nm, preferably between 0.5 nm and 50 nm, and a second step b2) of depositing, on the first coat 4a of $Al_2O_3$ obtained in step b1), a second coat 4b of $TiO_2$ having a thickness between 0.5 nm and 100 nm, preferably between 0.5 nm and 50 nm.

Particularly preferably, the first coat 4a of $Al_2O_3$ has a thickness between 30 nm and 50 nm and the second coat 4b of $TiO_2$ has a thickness between 10 nm and 50 nm.

Advantageously, step b) is carried out by means of a method selected from the group comprising an ALD, PVD, CVD, and sol-gel deposition.

Particularly preferably, step b) is carried out by means of ALD deposition.

Advantageously, the method according to the invention can combine protective coat deposition and plasma treatment, before and/or after step b2), typically an Ar plasma, in order to reduce the internal tensions of the protective coats deposited. This combination makes it possible to soften the protective coats to render them less brittle during environmental stress, such as mechanical, thermal or other stress.

Advantageously, the method for manufacturing the substrate according to the invention can comprise, between step a) and step b), at least one plasma pre-treatment step c) of the final silver-plated surface of the substrate obtained in step a).

This plasma pre-treatment step c) consists of stripping the final silver-plated surface in order to remove particularly the AgS/$Ag_2S$ sulphides which have formed naturally on the surface of the substrate exposed to the air and which prevent good adhesion of the protective coat 4.

Advantageously, this step c) consists of an Ar plasma or Ar/$H_2$ plasma pre-treatment.

According to an implementation of the method for manufacturing the substrate according to the invention, step b) is implemented directly after step c), without any other additional pre-treatment.

According to a further implementation, the method for manufacturing the substrate according to the invention comprises an additional intermediate oxidising pre-treatment step d), between step c) and step b), making it possible to create AgO/$Ag_2O$ sites forming covalent bonds between the $Al_2O_3$ present in the first coat 4a and the silver of the final silver-plated surface of the substrate so as to favour the adhesion of the protective coat 4 on the substrate.

According to an alternative embodiment, the oxidising pre-treatment of step d) can consist of an oxidising plasma pre-treatment with an oxidising agent such as oxygen, or Ar/$O_2$, making it possible to create the AgO/$Ag_2O$ sites.

The $O_2$ dosage in the plasma must be precise in order to create enough AgO/$Ag_2O$ sites, but which tend to turn silver yellow, while ensuring the whiteness of the silver.

The plasma treatment parameters are known to a person skilled in the art and do not require further details here.

According to a further alternative embodiment, the oxidising pre-treatment of step d) can consist of injecting water or hydrogen peroxide, in liquid form, into a pre-treatment chamber in a vacuum causing the evaporation of the water or hydrogen peroxide, which in contact with the substrate, will form AgO/$Ag_2O$ sites. The quantity of water or hydrogen peroxide injected is of the order of some tens of micromoles.

Particularly advantageously, step d) is carried out without venting between step c) and said step d). To this end, the substrate pre-treated according to step c) undergoes the additional pre-treatment according to step d) without breaking the vacuum.

Furthermore, the substrate obtained from step a) and pre-treated according to step c) only or according to steps c) and d) is then advantageously transferred in a vacuum into a deposition chamber, preferably by ALD deposition, for a direct implementation of step b) on the pre-treated substrate obtained from step c) or steps c) and d), without venting the final silver-plated surface of the substrate.

To this end, pre-treatment steps c) and d) and step b) of depositing the protective coat, preferably by ALD deposition, are advantageously implemented in the same overall treatment machine wherein the device for pre-treatment according to step c) or according to steps c) and d) is incorporated in the device for depositing the protective coat 4, preferably by ALD deposition, enabling an overall treatment without venting the final silver-plated surface of the substrate, and preferably in a vacuum, for the implementation of steps c), optionally d) if present, and b).

The substrate 1, 10, 100 of step a) is metallic, and preferably based on gold or silver.

Said substrate of step a) can comprise an initial silver-plated surface, said substrate then being based on silver and having intrinsically said initial silver-plated surface also forming the final silver-plated surface. The protective coat 4 is then deposited directly on the silver-based substrate according to step b).

According to a further alternative embodiment, if the substrate is made of solid silver, the colour thereof will not be as white as that of fine silver, it could then be intended to deposit, by means of galvanoplasty or a vacuum process, a coat of fine silver on solid silver, before depositing the protective coat.

According to a further preferred alternative embodiment, whether the substrate 1, 100 from step a) has an initial silver-plated surface or not, the method for producing the substrate according to the invention can comprise a step a1) of depositing on said substrate 1, 100 a coat 2 of a silver and copper alloy comprising between 0.1% and 10% by weight of copper with respect to the total weight of the alloy to obtain said final silver-plated surface, as shown in FIG. 1.

According to a further preferred alternative embodiment, if the substrate 100 from step a) has no initial silver-plated surface, the method for producing the substrate according to the invention can comprise an intermediate step a2) of depositing a coat 20 of substantially pure silver between said substrate 100 and the coat 2 of silver and copper alloy, as shown in FIG. 3.

According to a further preferred alternative embodiment, if the substrate 10 from step a) has no initial silver-plated surface, the method for producing the substrate according to the invention can comprise a step a3) of depositing a coat 20 of substantially pure silver on said substrate 10 to obtain said final silver-plated surface, as shown in FIG. 2. The same applies if the substrate from step a) has an initial silver-plated surface.

Advantageously, the substrate 1, 10, 100 can be heat-treated before at least one of steps a1), a2) or a3) and/or before step b) in order to relax any internal stress associated with the preceding machining or coat deposition steps. The treatment temperatures and durations are dependent on the nature of the substrate and the coats and must not impact the aesthetics of the part before the deposition of the protective coat from step b). The heat treatment parameters are known to a person skilled in the art and do not require further details here.

Regardless of the alternative embodiment with the coat of substantially pure silver, said coat 20 of substantially pure silver has a thickness between 200 nm and 3000 nm.

According to an embodiment, the coat 20 of substantially pure silver can have a thickness between 200 nm and 600 nm, preferably between 300 nm and 500 nm, in order to form a thin silver coating.

According to a further preferred embodiment, the coat 20 of substantially pure silver can have a thickness between 1000 nm and 3000 nm, preferably between 1500 nm and 2500 nm in order to form a thick silver coating, as explained above.

Regardless of the alternative embodiment with a coat of silver and copper alloy, said coat 2 of silver and copper alloy has either a thickness between 200 nm and 600 nm, advantageously between 300 nm and 400 nm, or, preferably, a thickness between 1000 nm and 3000 nm, and more preferably between 1500 nm and 2500 nm in order to form a thick coating as explained above.

Preferably, the silver and copper alloy comprises between 0.2% and 8% by weight, preferably between 0.5% and 7% by weight, of copper with respect to the total weight of the alloy.

When the substrate has a structuring on the surface thereof, such as engine-turning, step a) of the method for manufacturing for the substrate according to the invention comprises a substep whereby said structuring is produced on the surface of the substrate.

A substrate comprising a final silver-plated surface protected with a protective coat according to the invention, in particular when the protective coat against silver tarnishing has been deposited by ALD, has an appearance and very white brightness of the silver that are preserved despite the presence of the protective coat against silver tarnishing. If the substrate has undergone engine-turning, the fine details of the engine-turning remain clearly visible despite the presence of said protective coat against silver tarnishing.

Furthermore, the substrate according to the invention has a protective coat against silver tarnishing without any lack of adherence.

The substrates according to the invention can also be used to produce jewellery, writing implement, spectacle-related and leather good products.

The invention claimed is:

1. A substrate comprising:
   a final silver-plated surface, the final silver-plated surface being protected against silver tarnishing by a protective coat having a thickness between 1 nm and 100 nm, said protective coat comprises a first coat of $Al_2O_3$ deposited directly on said final silver-plated surface and having a thickness between 0.5 nm and 50 nm and directly on the first coat of $Al_2O_3$, a second coat of $TiO_2$ having a thickness between 0.5 nm and 50 nm,
   wherein the substrate includes a coat of a silver and copper alloy comprising between 0.1% and 10% by weight of copper with respect to the total weight of the alloy, forming said final silver-plated surface, said coat of a silver and copper alloy having a thickness between 1000 nm and 3000 nm, an entirety of the coat of silver and copper alloy being formed along a same first plane, and
   wherein the substrate includes a single coat of substantially pure silver deposited directly thereon so that the substantially pure silver is located between the substrate and the coat of silver and copper alloy, an entirety of the pure silver being formed along a same second plane different from the first plane.

2. The substrate according to claim 1, wherein the first coat of $Al_2O_3$ has a thickness between 30 nm and 50 nm and in that the second coat of $TiO_2$ has a thickness between 10 nm and 50 nm.

3. The substrate according to claim 1, wherein the protective coat has been deposited by Atomic Layer Deposition.

4. The substrate according to claim 1, wherein the substrate is based on silver.

5. The substrate according to claim 1, wherein the substrate is not based on silver.

6. The substrate according to claim 1, wherein the silver and copper alloy comprises between 0.5% and 7% by weight, of copper with respect to the total weight of the alloy.

7. A horological element comprising the substrate according to claim 1.

8. The substrate according to claim 1, wherein the substrate has a surface structuring.

9. A substrate comprising:
   a final silver-plated surface deposited directly on the substrate, the final silver-plated surface being protected against silver tarnishing by a protective coat having a thickness between 1 nm and 100 nm, said protective coat comprises a first coat of $Al_2O_3$ deposited directly on said final silver-plated surface and having a thickness between 0.5 nm and 50 nm and directly on the first coat of $Al_2O_3$, a second coat of $TiO_2$ having a thickness between 0.5 nm and 50 nm,
   wherein said substrate comprises a single coat of substantially pure silver forming said final silver-plated surface, said coat of substantially pure silver having a thickness between 1000 nm and 3000 nm, an entirety of the pure silver being formed along a same first plane.

10. The substrate according to claim 9, wherein the coat of substantially pure silver has a thickness between 1500 nm and 2500 nm.

\* \* \* \* \*